United States Patent
Jia et al.

(10) Patent No.: US 10,031,564 B2
(45) Date of Patent: Jul. 24, 2018

(54) HEAT DISSIPATION APPARATUS AND SYSTEM FOR AN ELECTRONIC DEVICE

(71) Applicant: Lenovo (Beijing) Limited, Beijing (CN)

(72) Inventors: Zizhou Jia, Beijing (CN); Ying Sun, Beijing (CN); Zhigang Na, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 0 days.

(21) Appl. No.: 15/392,053

(22) Filed: Dec. 28, 2016

(65) Prior Publication Data

US 2017/0185116 A1   Jun. 29, 2017

(30) Foreign Application Priority Data

Dec. 28, 2015  (CN) .......................... 2015 1 1001274
Dec. 28, 2015  (CN) .......................... 2015 1 1001412

(51) Int. Cl.
*G06F 1/20*    (2006.01)
*H05K 7/20*    (2006.01)
(Continued)

(52) U.S. Cl.
CPC .............. *G06F 1/20* (2013.01); *H01L 23/467* (2013.01); *H01L 23/473* (2013.01);
(Continued)

(58) Field of Classification Search
CPC ......... H01L 23/473; H01L 2924/01019; H01L 23/467; H05K 7/20272; H05K 7/20263; H05K 7/20154

See application file for complete search history.

(56) References Cited

U.S. PATENT DOCUMENTS 3,429,122 A * 2/1969  Pravda .................... F01D 5/181
                                                          165/104.26
6,290,882 B1 * 9/2001  Maus .................. B29C 45/0025
                                                          264/2.2
(Continued)

FOREIGN PATENT DOCUMENTS

CN       2681341 Y     2/2005
CN       1653405 A     8/2005
(Continued)

OTHER PUBLICATIONS

"First Office Action for Application No. 201511001274.3" The State Intellectual Property Office of People's Republic of China, dated Jul. 3, 2017, 13 pages.
(Continued)

*Primary Examiner* — Adam B Dravininkas
(74) *Attorney, Agent, or Firm* — Kunzler, PC

(57) ABSTRACT

An apparatus is disclosed that includes a heat pipe. The heat pipe includes a heat dissipation section arranged to dissipate heat using a fan. The heat pipe further includes a heat absorption section arranged to absorb heat from a heat source of an electronic device. The heat pipe further includes a heat dissipation medium disposed inside the heat pipe. The apparatus further includes a driving member coupled to the heat pipe and configured to drive the heat dissipation medium to flow circularly inside the heat pipe.

18 Claims, 3 Drawing Sheets

(51) Int. Cl.
*H01L 23/473* (2006.01)
*H01L 23/467* (2006.01)

(52) U.S. Cl.
CPC ..... *H05K 7/20154* (2013.01); *H05K 7/20263* (2013.01); *H05K 7/20272* (2013.01)

(56) References Cited

U.S. PATENT DOCUMENTS

| | | | | |
|---|---|---|---|---|
| 2004/0070949 | A1* | 4/2004 | Oikawa | F28D 15/0266 361/718 |
| 2005/0099775 | A1* | 5/2005 | Pokharna | H01L 23/3736 361/700 |
| 2006/0045755 | A1* | 3/2006 | McDonald | F04B 17/00 417/50 |
| 2006/0158849 | A1* | 7/2006 | Martin | H01L 23/473 361/699 |
| 2009/0084525 | A1* | 4/2009 | Satou | F28D 15/0266 165/104.21 |
| 2011/0114294 | A1* | 5/2011 | Degner | H01L 23/4006 165/104.26 |
| 2013/0063896 | A1* | 3/2013 | Satou | F28D 15/0266 361/700 |

FOREIGN PATENT DOCUMENTS

| | | |
|---|---|---|
| CN | 1677655 A | 10/2005 |
| CN | 101864280 A | 10/2010 |
| CN | 102478930 A | 5/2012 |
| CN | 102811588 A | 12/2012 |

OTHER PUBLICATIONS

"First Office Action for Application No. 201511001412.8" The State Intellectual Property Office of People's Republic of China, dated Jul. 3, 2017, 10 pages.

* cited by examiner

HEAT DISSIPATION APPARATUS AND SYSTEM FOR AN ELECTRONIC DEVICE

FIELD

The subject matter disclosed herein relates to heat dissipation apparatuses and more particularly, relates to a heat dissipation apparatus and system for an electronic device.

BACKGROUND

With the development of society, electronic devices are used more and more widely by people in their daily lives. There are a variety of electronic elements used in an electronic device. Elements such as a central processing unit ("CPU"), and the like, are heat sources that may generate a large amount of heat during use, and thus a heat dissipation system is used to dissipate heat from such heat sources.

SUMMARY

An apparatus and system for dissipating heat from an electronic device are disclosed. In one embodiment, the apparatus includes a heat pipe that includes: a heat dissipation section arranged to dissipate heat using a fan; a heat absorption section arranged to absorb heat from a heat source of an electronic device; a heat dissipation medium disposed inside the heat pipe; and a driving member coupled to the heat pipe and configured to drive the heat dissipation medium to flow circularly inside the heat pipe.

In one embodiment, a system is disclosed that includes a fan; a heat source of an electronic device; a heat pipe comprising: a heat dissipation section arranged to dissipate heat using a fan; and a heat absorption section arranged to absorb heat from a heat source of an electronic device; a heat dissipation medium disposed inside the heat pipe; and a driving member coupled to the heat pipe and configured to drive the heat dissipation medium to flow circularly inside the heat pipe.

In one embodiment, a system is disclosed that includes a fan; a heat source of an electronic device; a heat pipe comprising: a heat dissipation section arranged to dissipate heat using a fan; a heat absorption section arranged to absorb heat from a heat source of an electronic device; and a heat dissipation medium comprising a metal, the heat dissipation medium disposed inside the heat pipe, wherein heat dissipation medium wets the heat pipe; and a driving member coupled to the heat pipe proximally to the heat absorption section of the heat pipe, the driving member configured to drive the heat dissipation medium to flow circularly within the heat pipe along a direction from a first subsection of the heat dissipation section corresponding to an outlet of the fan to a second subsection of the heat dissipation section corresponding to an inlet of the fan.

BRIEF DESCRIPTION OF THE DRAWINGS

A more particular description of the embodiments briefly described above will be rendered by reference to specific embodiments that are illustrated in the appended drawings. It may be understood that these drawings depict only some embodiments and are not therefore to be considered to be scope limiting. A number of embodiments will be described and explained with additional specificity and detail through the use of the accompanying drawings, in which.

DETAILED DESCRIPTION

One type of heat dissipation apparatus for an electronic device is a capillary flow heat dissipation apparatus. Such an apparatus may include a heat pipe and a heat dissipation medium that flows within the heat pipe by capillary action of a capillary structure arranged inside the heat pipe. A first end of the heat pipe may be proximal to a heat source, such as, for example, a CPU of an electronic device. As the heat dissipation medium absorbs heat, generated by the heat source at the first end of the heat pipe, it is transformed into a gas.

The gaseous heat dissipation medium flows to a second end of the heat pipe, after which the gaseous heat dissipation medium where the cooling effect of a fan dissipates the heat at the second end and transforms the heat dissipation medium back into a liquid. Then, the liquid heat dissipation medium flows back to the first section of the heat pipe pulled by the capillary effect of the capillary structure. Thus, some heat dissipation for the heat source is achieved. However, the reflow of the heat dissipation medium 104 by capillary effect may limit heat dissipation speed and heat dissipation effect.

Figure 1:
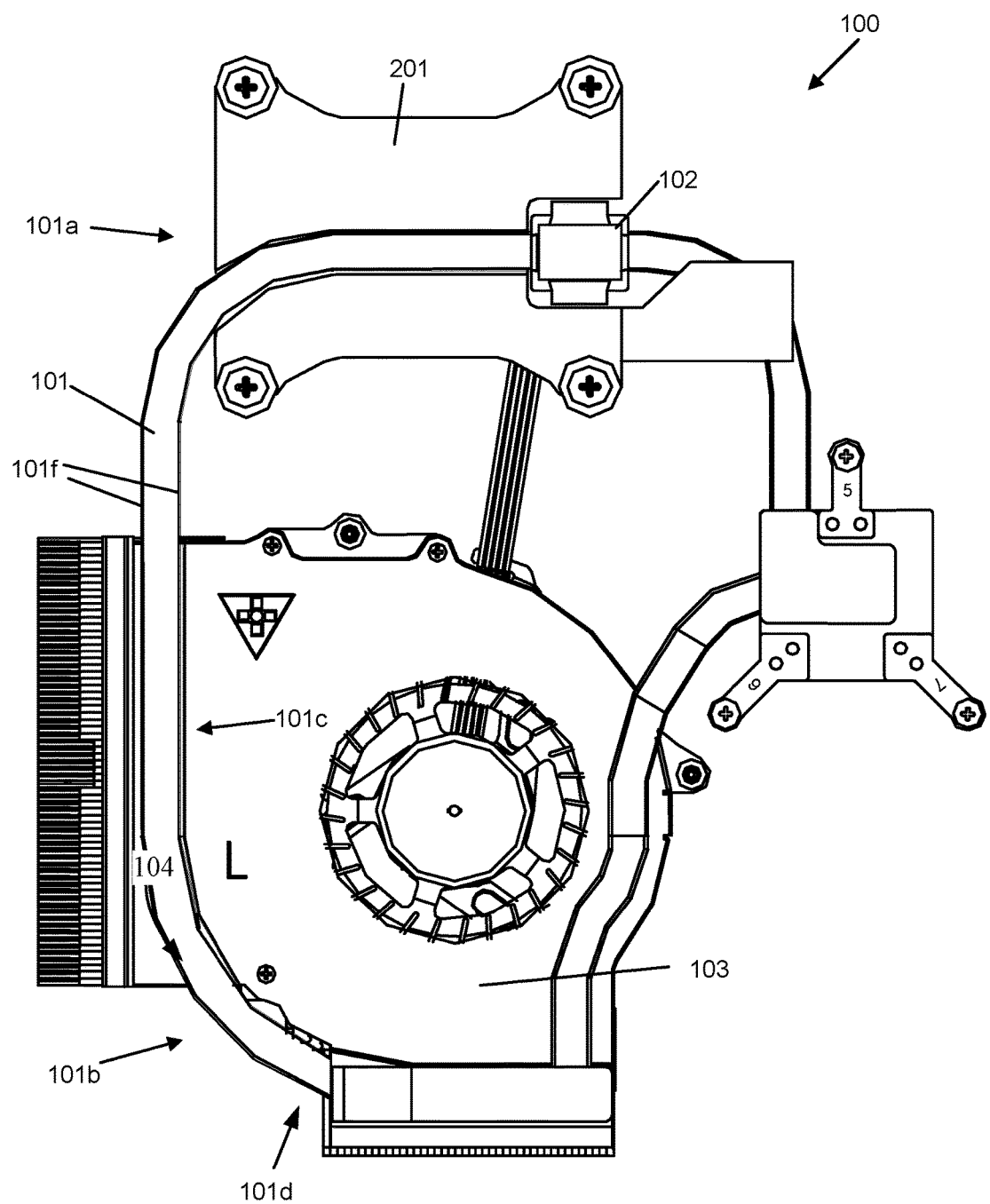
FIG. 1 is a schematic diagram depicting one embodiment of a heat dissipation apparatus for an electronic device.

FIG. 1 is a schematic diagram depicting one embodiment of an improved apparatus 100 for dissipating heat from a heat source 201 of an electronic device. In one embodiment, the apparatus 100 may include a heat pipe 101. The heat pipe 101 may include a heat dissipation section 101b. The heat pipe 101 may further include a heat absorption section 101a arranged to absorb heat from a heat source 201 of an electronic device. The apparatus 100 may further include a heat dissipation medium 104 disposed inside the heat pipe 101. The apparatus 100 may further include a driving member coupled to the heat pipe 101 and configured to drive the heat dissipation medium 104 to flow circularly inside the heat pipe. The apparatus 100 may further include a fan 103 arranged to dissipate heat from the heat dissipation section 101b of the heat pipe 101.

In some embodiments, a heat dissipation medium 104 is driven to flow circularly inside the heat pipe 101 by a driving member 102. Under the force of the driving member 102, the heat dissipation medium 104 flows quickly from a heat dissipation section 101b of the heat pipe 101, where the fan 103 dissipates the heat, back to a heat absorption section 101a, where the heat dissipation medium 104 absorbs heat from the heat source 201. The circular flow driven by the driving member 102 may continue to repeat in order to quickly and efficiently dissipate heat from heat source 201. In some embodiments, a system is also disclosed that includes an electronic device that uses the apparatus 100 to dissipate heat from the heat source 201 of the electronic device.

In some embodiments, the driving member is disposed proximally to the heat absorption section 101a of the heat pipe 101, such that the driving member 102 and the heat source 201 may each fit into a space having a particular thickness. This arrangement avoids an overall increase in the thickness and size of the apparatus 100 that would result with the driving member 102 disposed above the electronic device, and is helpful in implementing a thin and lightweight electronic device.

In apparatuses in which the heat dissipation medium 104 is shifted to a gas phase to absorb the heat, an upper threshold of heat absorption by the gas may be reached more quickly that would be in an apparatus where the heat absorption medium remains in a liquid phase. In some embodiments, the heat dissipation medium 104 that flows in the heat pipe 101 is a liquid that maintains its liquid phase during an entire process of heat absorption and heat dissipation. A heat dissipation medium 104 that maintains its liquid phase absorbs more heat when the heat source 201 generates a large amount of heat.

In some embodiments, the heat dissipation medium 104 flowing in heat pipe 101 is capable of maintaining a liquid state within a predetermined temperature range to better dissipate a limited amount of heat generated by heat source 201 of the electronic device. For example, a predetermined temperature range may be, for example, minus 20° C. to 100° C.

In some embodiments, the heat dissipation medium 104 may comprise a metal. For example, the heat dissipation medium 104 may comprise a gallium-indium alloy that is capable of maintaining a liquid state within the predetermined temperature range. In another exemplary embodiment, the heat dissipation medium 104 may comprise a potassium-sodium alloy. It may be noted a heat dissipation medium 104 that comprises a metal is not limited to the named examples.

In some embodiments, the driving member 102 may include an electromagnetic pump. In some embodiments, the driving member 102 may include another type of pump. The apparatus 100 may include any type of the driving member 102, to drive the heat dissipation medium 104 to continue flowing circularly through the heat pipe 101.

In some embodiments, since the heat dissipation medium 104 is capable of maintaining the liquid state within the predetermined temperature range, no phase shift is required during heat dissipation for the heat source 201, and the heat dissipation effect is good. Because of the greater heat dissipation efficiency of the heat dissipation medium 104 that remains in liquid phase, a smaller sized heat pipe 101 than would be favorable for a heat dissipation medium 104 that shifts phases may be employed. Thus, in some embodiments, the heat dissipation apparatus for the electronic device may be thin and lightweight.

Referring now to FIGS. 2-5, in some embodiments, the apparatus 100 may include heat pipe 101 that is small-sized and has a first and a second set of opposing side walls that form an enclosure through which the heat dissipation medium 104 may flow. For example, the heat pipe 101 may be configured to overlay the heat source 201 of the electronic device. Accordingly, a distance L1 between inner faces of the first set of opposing side walls may be 2 mm or less. In some embodiments, a distance L2 between the inner walls 101f of the second set of opposing side walls may be 25 mm or less.

Figure 2:
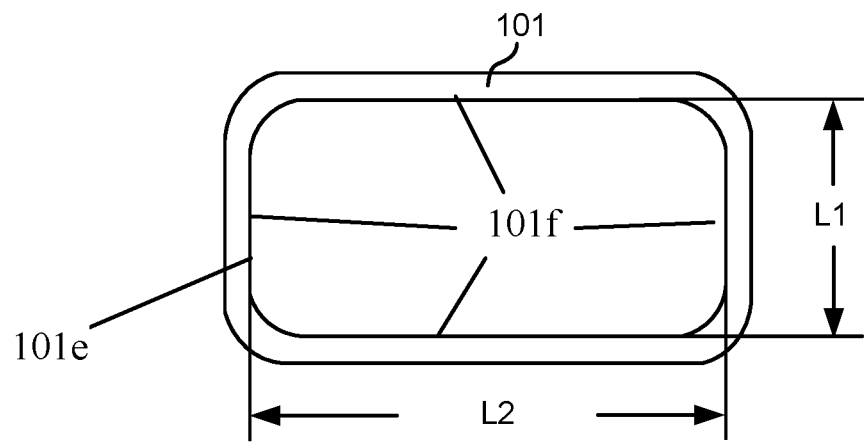
FIG. 2 is a schematic sectional view depicting one embodiment of a heat pipe having a rounded rectangle shape.
Figure 3:
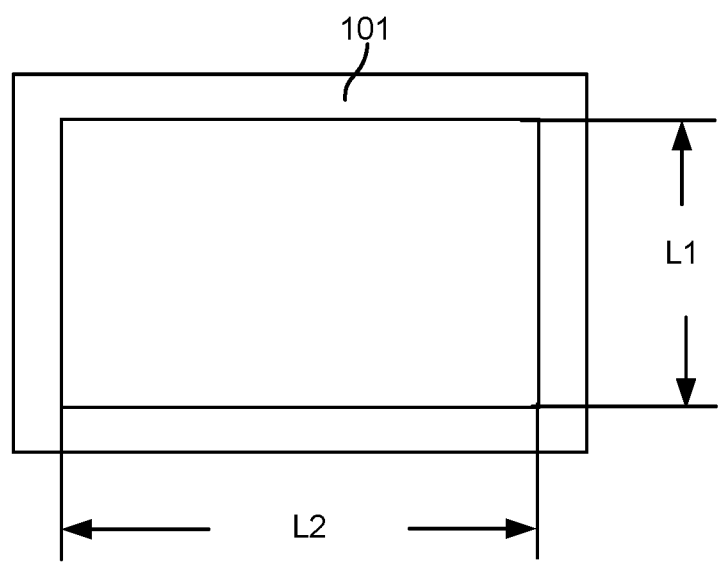
FIG. 3 is a schematic sectional view depicting one embodiment of a heat pipe having a rectangular shape.
Figure 4:
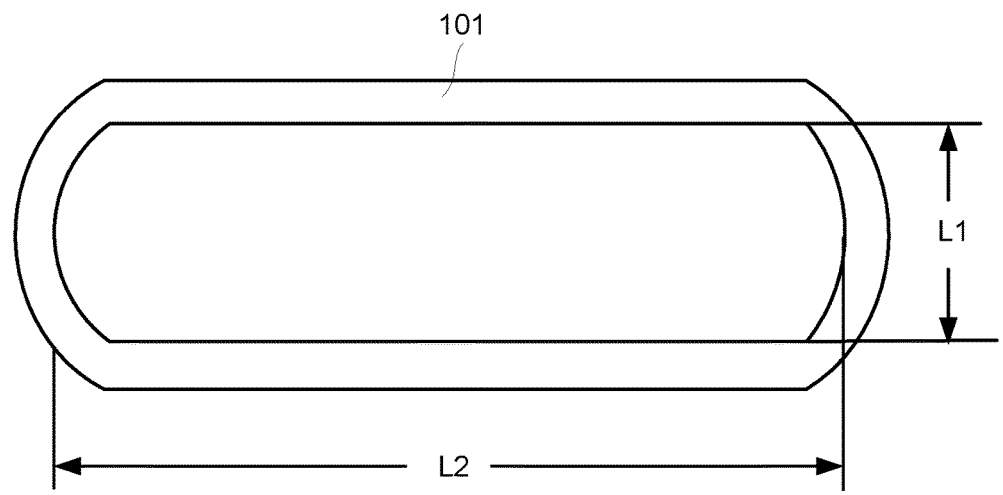
FIG. 4 is a schematic sectional view depicting one embodiment of a heat pipe having an ellipsoid rectangle shape.
Figure 5:
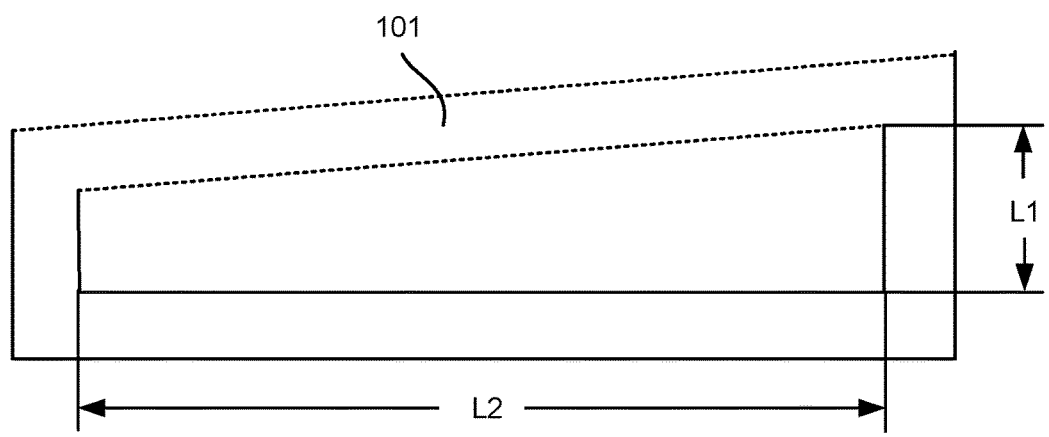
FIG. 5 is a schematic sectional view depicting one embodiment of a heat pipe having a trapezoid shape.

In some embodiments, the shape and the dimensions of the heat pipe 101 may vary. For example, FIG. 2 is a schematic sectional view depicting one embodiment of a heat pipe 101 having a rounded rectangle shape. FIG. 3 is a schematic sectional view depicting one embodiment of a heat pipe 101 having a rectangular shape. FIG. 4 is a schematic sectional view depicting one embodiment of a heat pipe 101 having an ellipsoidal rectangle shape. FIG. 5 is a schematic sectional view depicting one embodiment of a heat pipe 101 having a trapezoid shape. Thus, various sizes and shapes of the heat pipe 101 may be configured to suit a particular application.

Returning now to the apparatus 100 of FIGS. 1 and 2, in some embodiments, the heat pipe 101 is sealed and an internal flow passage of the heat pipe 101 may be fully filled by the heat dissipation medium 104. In some embodiments, the internal flow passage of the heat pipe 101 may be filled by the heat dissipation medium 104 and air, for example, to facilitate easier manufacturing.

In some embodiments, the heat pipe 101 may include an inner wall 101f that is wetted by the heat dissipation medium 104. For example, a heat pipe 101 with a small size may advantageously include an inner wall 101f that is wetted by the heat dissipation medium 104, to help prevent the heat dissipation medium 104 inside the heat pipe 101 from generating bubbles or forming a plurality of non-contiguous liquid beads of the heat dissipation medium 104 due to surface tension. The wetting may also help ensure that the heat dissipation medium 104 is capable of circularly flowing inside the heat pipe 101 to continue dissipating heat from the heat source 201.

In some embodiments, heat pipe 101 may be directly made from a material capable of wetting with the heat dissipation medium 104. In other embodiments, a wetting layer 101e to be wetted by the heat dissipation medium 104 may be arranged on the inner wall 101f of the heat pipe 101. For example, the wetting layer 101e may comprise a rubber coating or an electroplated coating, such as for example, a nickel plated coating, that is capable of being wetted by the heat dissipation medium 104.

In some embodiments, the heat dissipation medium 104 is liquid and comprises a gallium-indium alloy. The heat pipe 101 may be a copper pipe with the inner wall 101f having a nickel coating or an aluminum pipe with the inner wall 101f having a nickel coating. In some embodiments, the heat pipe 101 may also be made from another material or to be provided with another wetting layer 101e according to the wetting requirements of the heat dissipation medium 104.

In some embodiments, the fan 103 is large in size and has an air inlet and an air outlet. To enable the heat dissipation medium 104 to quickly dissipate heat in the heat dissipation section 101b of the heat pipe 101, the heat dissipation section 101b of the heat pipe 101 may comprise a first heat dissipation subsection corresponding to an outlet of the fan 103 and a second heat dissipation subsection corresponding to an inlet of the fan 103.

In some embodiments, a flow of air flows by the second heat dissipation subsection and enters the inlet of the fan 103, such that the heat absorbed by the heat dissipation medium 104 is dissipated at the second heat dissipation subsection. After which, the air flow is exhausted from the outlet of the fan 103, and flows by the first heat dissipation subsection, such that the heat absorbed by the heat dissipation medium 104 is dissipated at the first heat dissipation section. It may be notes that the operation of 103 may form air flows at various subsections of the heat pipe 101 that may improve the heat dissipation efficiency of the apparatus 100.

In some embodiments, the heat dissipation medium 104 flows along a direction from the first heat dissipation subsection, which corresponds to the outlet of the fan 103, to the second heat dissipation subsection, which corresponds to the inlet of fan 103.

In one embodiment, as depicted in FIG. 1, a system includes a heat source 201 of an electronic device. The system further includes a fan 103. The system further includes a heat pipe 101 that includes: a heat dissipation section 101b arranged to dissipate heat using the fan 103. The heat pipe 101 further includes a heat absorption section 101a arranged 101A to absorb heat from the heat source. The heat pipe 101 further includes a heat dissipation medium 104 disposed inside the heat pipe 101; and a driving member 102 coupled to the heat pipe 101 and configured to drive the heat dissipation medium 104 to flow circularly inside the heat pipe 101.

The electronic device uses the heat dissipation system provided in the above embodiments, which has the advantages of bettering a heat dissipation effect for a heat source 201. In addition, the electronic device also possesses the other technical effects of the heat dissipation system provided in the above embodiments, therefore they are not described herein any further.

Various embodiments in the specification are described in a progressive manner. The same or similar parts between the embodiments may be referenced to each other. In each embodiment, the portion that is different from other embodiments is concentrated and described.

The disclosed description of the embodiments enables a person skilled in the art to practice or use the present embodiments. Various modifications made to these embodiments are obvious to a person skilled in the art. General principles defined herein in this specification may be practiced in other embodiments without departing from the spirit and scope of the present embodiments. Therefore, the present embodiments would not be limited to these exemplary embodiments disclosed herein, rather complies with the broadest scope consistent with the principles and novel features disclosed in this specification.

What is claimed is:

1. An apparatus comprising:
    a heat pipe comprising:
        a heat dissipation section arranged to dissipate heat using a fan;
        a heat absorption section arranged to absorb heat from a heat source of an electronic device by a heat dissipation medium that is disposable inside the heat pipe;
        and
    a driving member coupled to the heat pipe and configured to drive the heat dissipation medium to flow circularly inside the heat pipe,
    wherein an inner wall of the heat pipe comprises a wetting layer that is wetted by the heat dissipation medium as the heat dissipation medium flows inside the heat pipe, and the wetting layer comprises a coating selected from a group consisting of plastic and nickel.

2. The apparatus of claim 1, wherein the driving member is disposed proximally to the heat absorption section of the heat pipe.

3. The apparatus of claim 1, wherein the heat dissipation medium is a liquid that maintains its liquid phase during an entire process of heat absorption and heat dissipation.

4. The apparatus of claim 3, wherein the heat dissipation medium comprises a metal.

5. The apparatus of claim 4, wherein the metal is selected from the group consisting of a gallium-indium alloy, and a potassium-sodium alloy.

6. The apparatus of claim 4, wherein the heat dissipation medium is capable of maintaining a liquid state in a predetermined temperature range.

7. The apparatus of claim 6, wherein the predetermined temperature range is from minus 20° C. to 100° C.

8. The apparatus of claim 1, wherein the driving member is an electromagnetic pump.

9. The apparatus of claim 1, wherein the inner wall of the heat pipe is wetted by the heat dissipation medium.

10. The apparatus of claim 1, wherein:
    the heat pipe is made of a material selected from the group consisting of copper, and aluminum;
    the wetting layer comprised a nickel coating.

11. The apparatus of claim 1, wherein the heat dissipation section of the heat pipe comprises a first subsection corresponding to an outlet of the fan and a second subsection corresponding to an inlet of the fan.

12. The apparatus of claim 11, wherein the heat dissipation medium flows along a direction from the first subsection to the second subsection.

13. The apparatus of claim 1, wherein the heat pipe comprises a first set of opposing side walls and a second set of opposing side walls.

14. The apparatus of claim 13, wherein first set of opposing side walls are separated by no more than 25 mm.

15. The apparatus of claim 13, wherein the first set of opposing side walls and the second set of opposing side walls for a shape selected from the group consisting of a rounded rectangle, an ellipsoid rectangle, a rectangle, and a trapezoid.

16. A system comprising:
    a fan;
    a heat source of an electronic device;
    a heat pipe comprising:
        a heat dissipation section arranged to dissipate heat using the fan; and
        a heat absorption section arranged to absorb heat from the heat source of the electronic device by a heat dissipation medium that is disposable inside the heat pipe, wherein an inner wall of the heat pipe comprises a wetting layer, and wherein the wetting layer comprises a coating comprising nickel;
        and
    a driving member coupled to the heat pipe and configured to drive the heat dissipation medium to flow circularly inside the heat pipe.

17. The system of claim 16, wherein the heat dissipation medium is a liquid heat dissipation medium comprising a metal, and wherein the heat dissipation medium is capable of maintaining a liquid state in a predetermined temperature range of minus 20° C. to 100° C.

18. A system comprising:
    a fan;
    a heat source of an electronic device;
    a heat pipe comprising:
        a heat dissipation section arranged to dissipate heat using the fan;
        a heat absorption section arranged to absorb heat from the heat source of the electronic device; and
        a heat dissipation medium comprising a metal, the heat dissipation medium disposed inside the heat pipe, wherein the heat dissipation medium wets the heat pipe; and
    a driving member coupled to the heat pipe proximally to the heat absorption section of the heat pipe, the driving member configured to drive the heat dissipation medium to flow circularly within the heat pipe along a direction from a first subsection of the heat dissipation section corresponding to an outlet of the fan to a second subsection of the heat dissipation section corresponding to an inlet of the fan, wherein an inner wall of the heat pipe comprises a wetting layer that is wetted by the heat dissipation medium as the heat dissipation medium flows inside the heat pipe, and the wetting layer comprises a coating selected from a group consisting of plastic and nickel.

\* \* \* \* \*